(12) United States Patent
Panov et al.

(10) Patent No.: US 9,344,045 B2
(45) Date of Patent: May 17, 2016

(54) AMPLIFIER AND METHOD OF AMPLIFYING A DIFFERENTIAL SIGNAL

(71) Applicants: Georgi Panov, Munich (DE); Rinaldo Zinke, Munich (DE)

(72) Inventors: Georgi Panov, Munich (DE); Rinaldo Zinke, Munich (DE)

(73) Assignee: Intel Mobile Communications GmbH, Nuebiberg (DE)

( * ) Notice: Subject to any disclaimer, the term of this patent is extended or adjusted under 35 U.S.C. 154(b) by 533 days.

(21) Appl. No.: 13/904,345

(22) Filed: May 29, 2013

(65) Prior Publication Data

US 2014/0355790 A1     Dec. 4, 2014

(51) Int. Cl.
| H03F 3/38 | (2006.01) |
| H03F 3/217 | (2006.01) |
| H03F 3/187 | (2006.01) |
| H03F 3/45 | (2006.01) |

(52) U.S. Cl.
CPC .............. H03F 3/217 (2013.01); H03F 3/187 (2013.01); H03F 3/45475 (2013.01)

(58) Field of Classification Search
CPC .................................. H03F 3/38; H03F 3/217
USPC ....................................... 330/10, 251, 207 A
See application file for complete search history.

(56) References Cited

U.S. PATENT DOCUMENTS

| 6,842,486 | B2 * | 1/2005 | Plisch et al. ................. 375/247 |
| 9,071,201 | B2 * | 6/2015 | Jones et al. |
| 2007/0279127 | A1 * | 12/2007 | Lee ................................. 330/10 |
| 2015/0171766 | A1 * | 6/2015 | Valiani et al. ................. 330/10 |

OTHER PUBLICATIONS

Forejit, et al., "A 700+-mW Class D Design With Direct Battery Hookup in a 90-nm Process", IEEE Journal, vol. 40, No. 9, pp. 1880-1887, Sep. 2005.

* cited by examiner

Primary Examiner — Henry Choe
(74) Attorney, Agent, or Firm — Schiff Hardin LLP

(57) ABSTRACT

An amplifier includes a differential input with a positive and a negative input and an analog integrator with a differential integrator input and a differential integrator output. The analog integrator further includes an operational amplifier with a positive operational amplifier input, a negative operational amplifier input, a positive operational amplifier output and a negative operational amplifier output. The differential integrator input is coupled to the differential input. A ternary pulse width modulator includes two modulator inputs coupled to the differential integrator output and two modulator outputs. A first feedback path is coupled between a first of the two modulator outputs and the positive operational amplifier input and a second feedback path is coupled between a second of the two modulator outputs and the negative operational amplifier input. A first divert capacitor is coupled between the positive operational amplifier input and a constant voltage reference. A second divert capacitor is coupled between the negative operational amplifier input and the constant voltage reference.

17 Claims, 7 Drawing Sheets

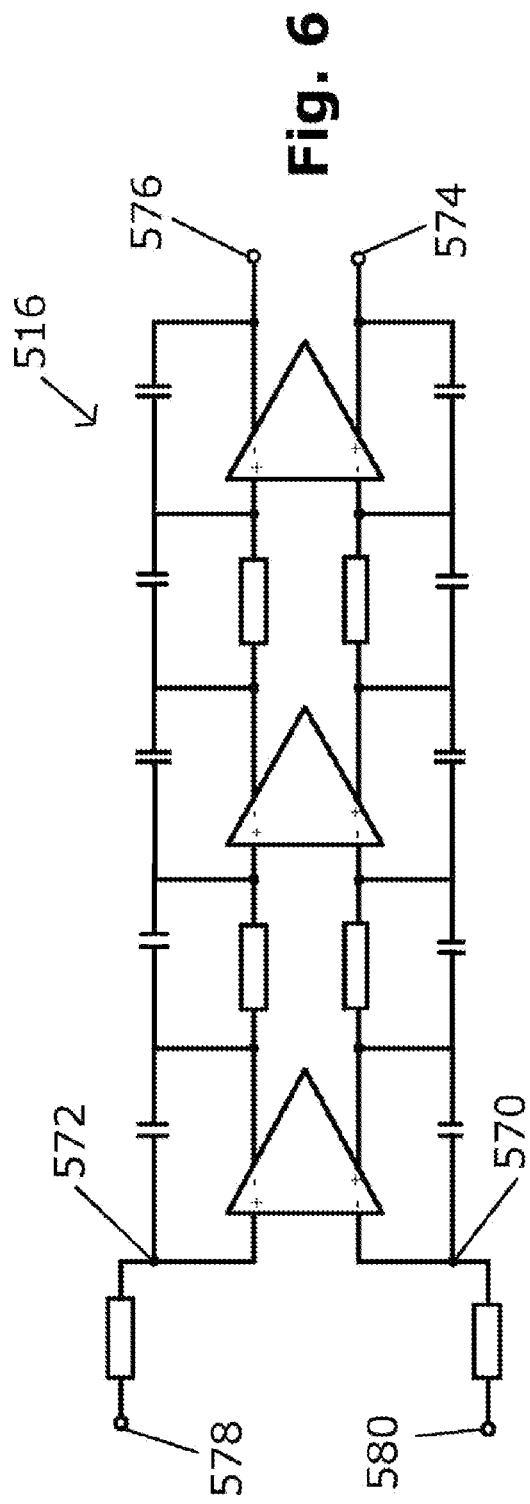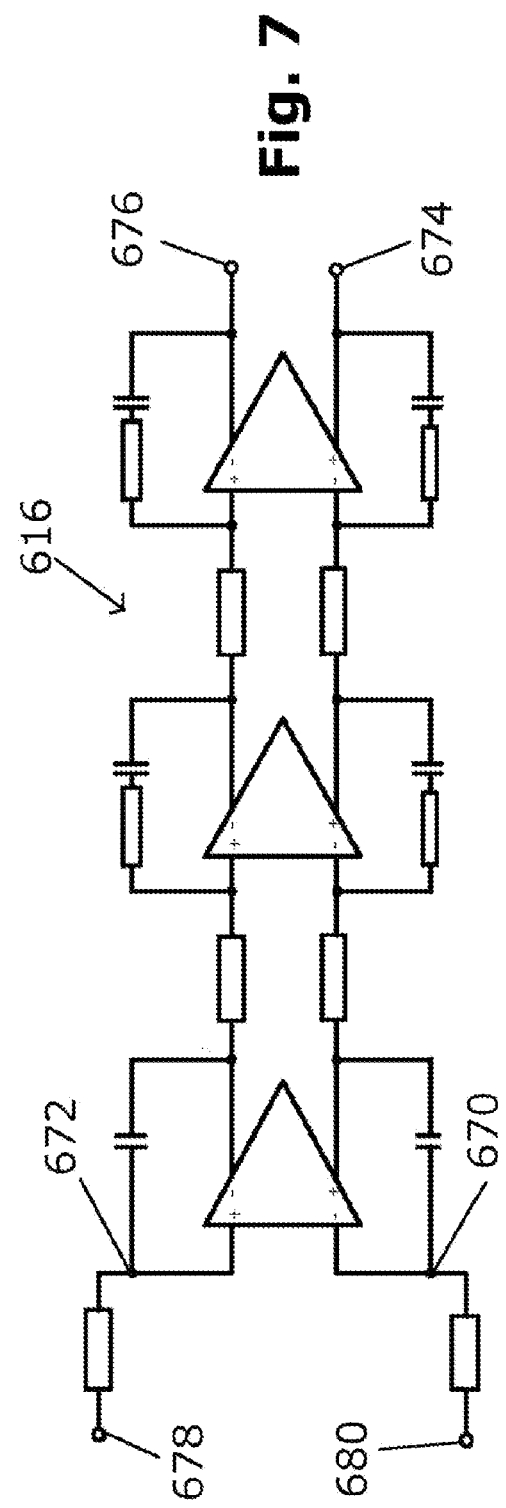

AMPLIFIER AND METHOD OF AMPLIFYING A DIFFERENTIAL SIGNAL

FIELD

The disclosure generally relates to amplifiers and to a method of amplifying a differential signal. The disclosure further relates to an audio system and to a mobile device including an amplifier. In one aspect, the disclosure relates to a Class-D amplifier.

BACKGROUND

An important characteristic of amplifiers is their efficiency. A low-efficiency design may lead to a local dissipation of power in form of heat. The efficiency may be most important for small systems as e.g. handheld devices or systems-on-chip, the adverse effects of heat in integrated circuits being well known.

Class-D amplifiers are analog amplifiers which are also called switching amplifiers. They include power devices which are switched, e.g. transistors used in the end stage switching between an ON state and an OFF state. Class-D amplifiers have a theoretical efficiency of 100% and practically over 90% may be reached.

Another aspect in amplifier design, especially in small systems, may be the voltage supply. A low voltage may be suitable for low power consumption; however, for some applications the full available battery voltage may be required. In class-D amplifiers for example, the switching transistors may advantageously switch between a battery voltage and ground.

A further aspect may be the capability of an amplifier to work correctly with small input signals as well as with large input signals.

Amplifiers constantly have to be improved with regard to their performance. For these and further reasons there is a need for the present disclosure.

BRIEF DESCRIPTION OF THE DRAWINGS

The accompanying drawings are included to provide a further understanding of exemplary amplifiers and methods of amplifying and are incorporated in and constitute a part of this specification. The drawings illustrate examples and together with the description serve to explain principles. Other examples and many of the intended advantages of examples will be readily appreciated as they become better understood by reference to the following detailed description.

FIG. 6 shows a simplified schematic of an exemplary third order loop filter with a capacitive filter feedback.

FIG. 7 shows a simplified schematic of an exemplary third order loop filter with a resistor and a capacitor in a filter feedback.

DETAILED DESCRIPTION

Figure 1:
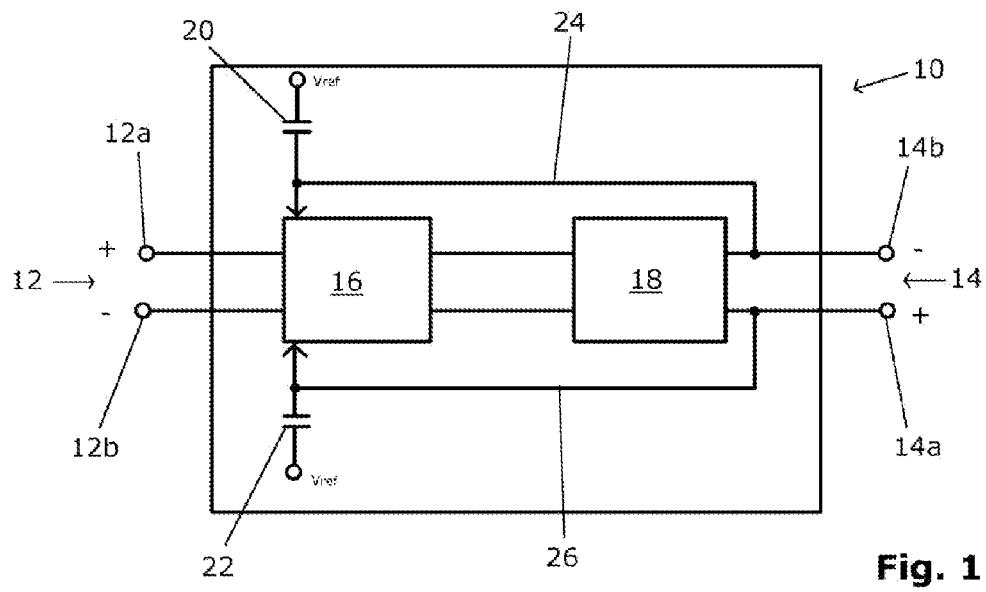
FIG. 1 shows a simplified block diagram of an exemplary amplifier.

In the following, examples are described with reference to the drawings wherein like reference numerals are generally utilized to refer to like elements throughout. In the following description, for purposes of explanation, numerous specific details are set forth in order to provide a thorough understanding of one or more aspects. However, it may be evident to a person skilled in the art that one or more aspects may be practiced with a lesser degree of these specific details. The following description is therefore not to be taken in a limiting sense, and the scope of protection is defined by the appended claims.

The various aspects summarized may be embodied in various forms. The following description shows by way of illustration various combinations and configurations in which the aspects may be practiced. It is understood that the described aspects and/or examples are exemplary and that other aspects and/or examples may be utilized and structural and functional modifications may be made without departing from the scope of the present disclosure. In addition, while a particular feature or aspect of an example may be disclosed with respect to only one of several implementations, such feature or aspect may be combined with one or more other features or aspects of the other implementations as it may be desired and advantageous for any given or particular application.

Further, to the extent that the terms "include", "have", "with" or other variants thereof are used in either the detailed description or the claims, such terms are intended to be inclusive in a manner similar to the term "comprise". Also, the term "exemplary" is merely meant as an example, rather than the best or optimal. As employed in this specification, the terms "coupled" or "connected" are not meant to mean that elements must be directly coupled or connected together. Intervening elements may be provided between the "coupled" or "connected" elements. For electrical components as for example capacitors, resistors and operational amplifiers "coupled" means "electrically coupled".

FIG. 1 shows an exemplary amplifier 10. The amplifier 10 may be a differential amplifier with a differential input 12 and a differential output 14. The amplifier 10 may include an analog integrator 16, a pulse width modulator 18, a first capacitor 20, and a second capacitor 22. The differential input 12 may include a positive input 12a and a negative input 12b. The differential output 14 may include a positive output 14a and a negative output 14b. The analog integrator 16 may include a differential integrator input. The positive input 12a may be coupled to a positive input of the differential integrator input of analog integrator 16. The negative input 12b may be coupled to a negative input of the differential integrator input of analog integrator 16. The analog integrator 16 may include a differential output which may be coupled to a differential input of pulse width modulator 18. The pulse width modulator 18 may include a differential output which may be coupled to the differential output of the amplifier 10. The analog integrator 16 may be a filter or more precisely a low pass filter of first, second or third order. An even higher order may be possible.

A first feedback path 24 may be coupled between the negative output 14b of the amplifier 10 and the analog integrator 16. A second feedback path 26 may be coupled between the positive output 14a of the amplifier 10 and the analog integrator 16. The capacitor 20 may be coupled between the first feedback path and a constant voltage reference $V_{ref}$. The capacitor 22 may be coupled between the second feedback path and the constant voltage reference $V_{ref}$.

The amplifier 10 may be a fully differential amplifier and may be used as an audio amplifier, e.g. in a mobile device. Functioning of amplifier 10 is described in the following. An analog signal may be applied as an input signal to positive input 12a. In the case of an audio amplifier the input may be an audio signal with a frequency included generally between about 20 Hz and about 20 kHz which is the audible frequency range. The inverse analog signal may be applied as an input signal to negative input 12b. The analog integrator 16 may process the input signal and the inverse input signal independently.

The input signal and the inverse input signal may be transmitted separately to the pulse width modulator 18. The pulse width modulator 18 may use a natural sampling method as explained below or another suitable modulation method. The pulse width modulator 18 may process the input signal and the inverse input signal separately. At positive output 14a may be provided the pulse width modulated inverse input signal and at negative output 14b may be provided the pulse width modulated input signal. The differential output 14 may provide a signal which may be the difference between the signal at the positive output 14a and the signal at the negative output 14b.

Amplifier 10 may be called a switching amplifier or a class D amplifier. The differential output signal may be a pulse width modulated signal which amplitudes may switch between a high voltage level, a low voltage level and an intermediate voltage level. It may be a ternary signal. In a mobile device the high and low voltage levels may be the battery voltage and 0 Volts or ground.

The pulse width modulated input signal may be fed back from negative output 14b via feedback path 24 to analog integrator 16 and the pulse width modulated inverse input signal may be fed back from positive output 14a via feedback path 26 to analog integrator 16. By using this closed loop architecture, the amplifier performance in terms of supply and substrate noise rejection can be improved. Amplifier 10 may be a class D amplifier. It may also be an inductor less amplifier.

If no input signal is provided at differential input 12, the pulse width modulated input signal at negative output 14b may be the same as the pulse width modulated inverse input signal at positive output 14a. Consequently, analog integrator 16 may receive via the feedback path 24 and the feedback path 26 a common mode signal. A common mode signal in a differential system may include two signals which may have the same polarity, i.e. which are not inverse but concordant. This may be in contrast to the differential approach always including two inverse signals. The analog integrator 16 may be limited in its capability to support a common mode signal.

The capacitors 20 and 22 may be provided to divert a common mode current from the feedback paths 24 and 26 to a constant voltage reference $V_{ref}$. The capacitors 20 and 22 may protect analog integrator 16 from a common mode signal. The constant voltage reference $V_{ref}$ may be ground, a supply voltage or any other voltage source available. Advantageously, the constant voltage reference $V_{ref}$ may be noise free for not adding any noise to the amplifier. Also, the capacitors 20 and 22 may have the same capacitance value and the same voltage dependency. In other words, the capacitors 20 and 22 may be matched capacitors for not introducing any imbalance into the amplifier 10.

The amplifier 10 may be realized as an integrated circuit. A suitable technology for realizing the amplifier 10 may be the BiCMOS technology. The capacitors 20 and 22 may be realized using the same process steps having both the same dimensions in order to provide matched capacitors. The capacitance values may be determined such that a good capability to transmit common mode current to the constant voltage source may be provided and such that the overall performance of the amplifier may be influenced the less possible.

Figure 2:
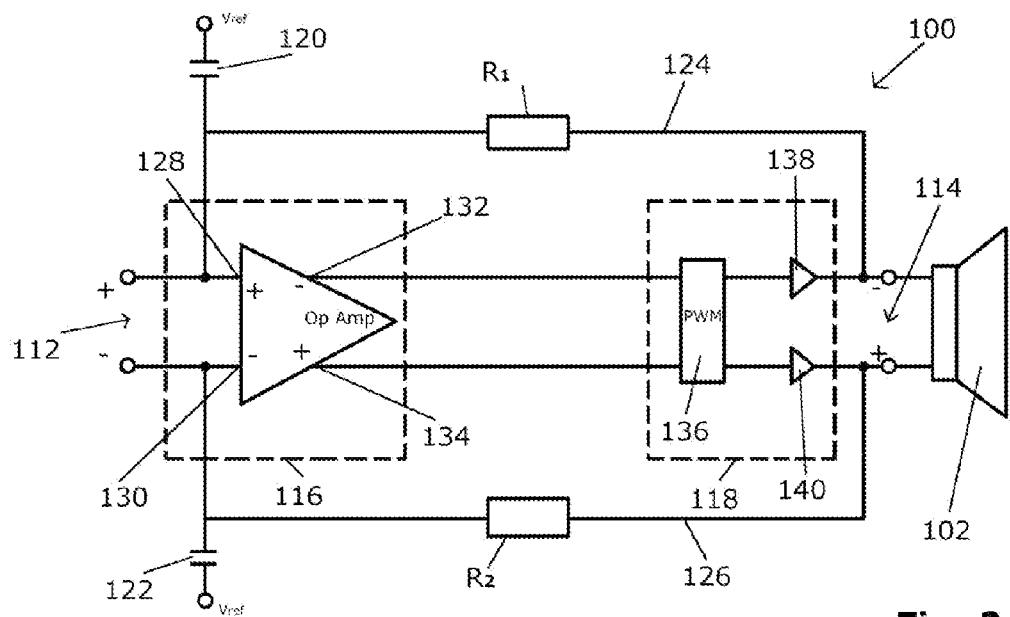
FIG. 2 shows a simplified block diagram of an exemplary amplifier including an operational amplifier.

FIG. 2 shows a simplified block diagram of an exemplary amplifier 100 and a loudspeaker 102 coupled thereto. The amplifier 100 and loudspeaker 102 may form an audio system. The amplifier 100 may include an analog integrator 116 and a pulse width modulator 118. The amplifier 100 may be a differential amplifier comparable to the amplifier 10 and may include a differential input 112 and a differential output 114. The structure of the amplifier 100 may be similar to the structure of the amplifier 10. The loudspeaker 102 may be coupled to the differential output 114. A feedback path 124 between a negative output of the differential output 114 and the analog integrator 116 may include a resistor $R_1$ and a feedback path 126 between a positive output of the differential output 114 and the analog integrator 116 may include a resistor $R_2$. The resistors $R_1$ and $R_2$ may influence the feedback loop. The analog integrator 116 may function as a loop filter in the feedback loop or more specifically in the two feedback loops.

The analog integrator or loop filter 116 may include an operational amplifier Op Amp which may have a positive operational amplifier input 128, a negative operational amplifier input 130, a negative operational amplifier output 132 and a positive operational amplifier output 134. The positive operational amplifier input 128 and the negative operational amplifier input 130 may be coupled to the differential input 112. The operational amplifier Op Amp may be fully differential. The analog integrator 116 is shown in a very simplified way and may be realized as a loop filter of $n^{th}$ order, n being 1, 2, 3, . . . . The feedback path 124 may be coupled to the positive operational amplifier input 128 and the feedback path 126 may be coupled to the negative operational amplifier input 130. A capacitor 120 may be coupled between the positive operational amplifier input 128 and a constant voltage reference $V_{ref}$ and a capacitor 122 may be coupled between the negative operational amplifier input 130 and the constant voltage reference $V_{ref}$ which may be noise free or which has at least a very low noise level.

The capacitors 120 and 122 may be called divert capacitors because they may divert part of the feedback signal to a constant voltage and away from the analog integrator 116. They may divert part of the feedback signal to an alternative current ground. This may be the device ground. The constant voltage may also be a supply voltage or any other reference voltage. The capacitors 120 and 122 may be dimensioned to protect the operational amplifier Op Amp from common-mode feedback signals.

The pulse width modulator 118 may include a modulation unit 136 with two modulator inputs, i.e. a differential modulator input and two modulator outputs, i.e. a differential modulator output. The modulator inputs may be coupled to the negative operational amplifier output 132 and to the positive operational amplifier output 134, respectively. The pulse width modulator 118 may further include two drivers 138 and 140. The modulator outputs may be coupled to drivers 138 and 140 which may be coupled with their outputs to the differential output 114. The pulse width modulator 118 may be a ternary pulse width modulator. Ternary means that at the differential output 114 three different levels may be possible. This is in contrast to binary which means that only two different levels may be possible.

The drivers 138 and 140 may be realized as power MOSFETs. These power MOSFETs may be connected with their respective drain-source path between the highest available voltage level in the device, e.g. directly to the battery, and ground. These power MOSFETs may be used as switches switching between an ON state and an OFF state leading to a change between the battery level and zero at the positive output and at the negative output of differential output 114.

In operation, complementary signals may be provided at the differential input 112 of the amplifier 100. More specifically, an analog input signal, possibly an audio signal, may be provided at a positive input of the differential input 112 and the inverse input signal may be provided at a negative input of differential input 112. As explained with reference to FIG. 1, the input signal and the inverse input signal may be processed in parallel so that at the differential output 114 a pulse width modulated input signal may be provided at a negative output and a pulse width modulated inverse input signal may be provided at a positive output. The difference between these two signals may be a ternary pulse width modulation signal. It may have a first level, when both amplitudes of the two signals are positive, it may have a second level, when both amplitudes of the two signals are negative (or zero), and it may have a third level, when the two amplitudes are different. A ternary pulse width modulation signal is explained in more detail below.

Figure 3:
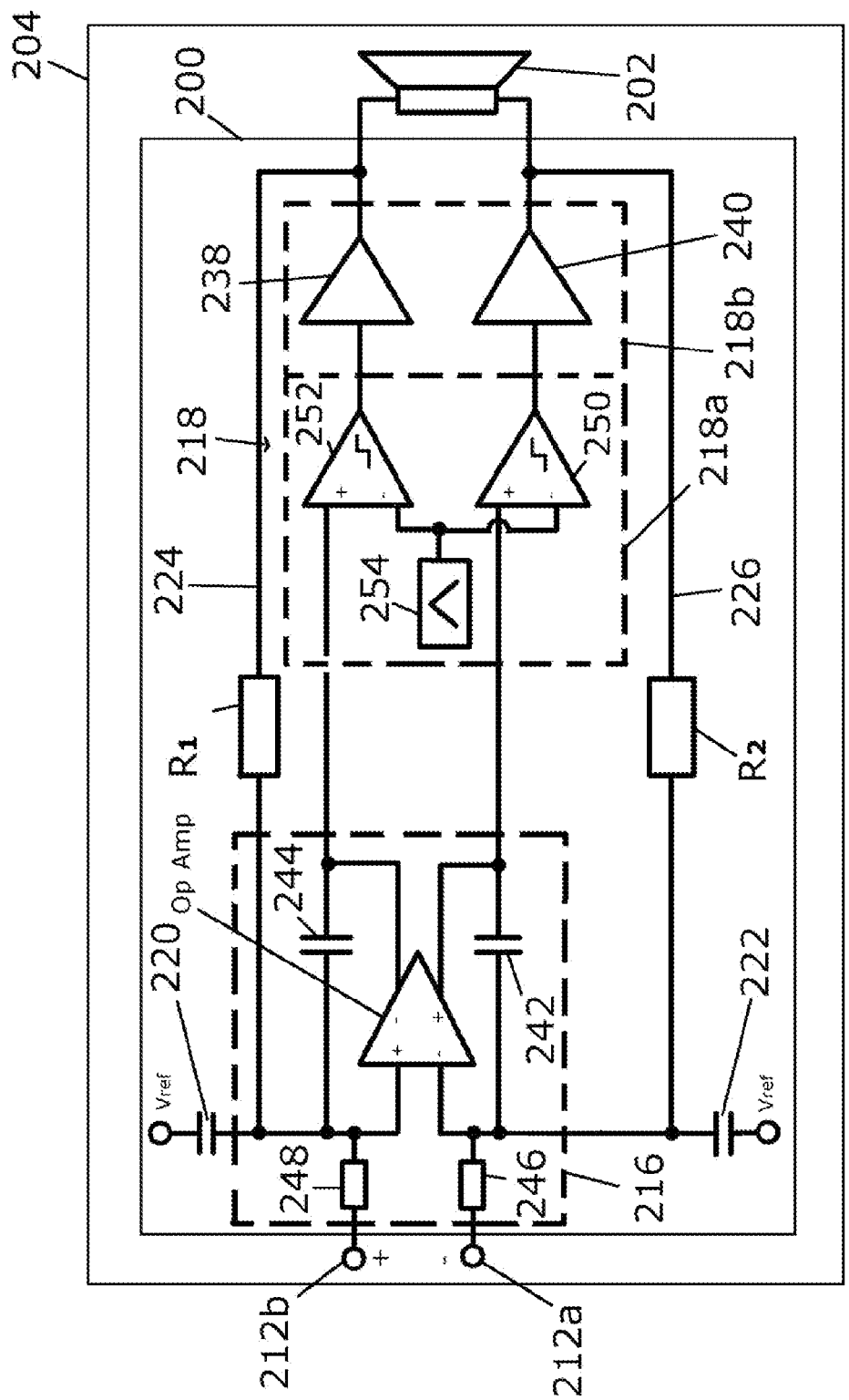
FIG. 3 shows an audio system including an exemplary amplifier with a first order loop filter.

FIG. 3 shows an exemplary amplifier 200 with a loudspeaker 202 included in an audio system 204. The audio system 204 may form a part of a mobile device. The amplifier 200 may include an analog integrator 216 and a ternary pulse width modulator 218 with a modulator unit 218a and a power unit 218b. The amplifier 200 may be a differentially amplifier as are amplifiers 10 and 100 including two signal paths for processing an input signal and an inverse input signal. Only the differences to FIGS. 1 and 2 will be explained.

The analog integrator 216 may include an operational amplifier Op Amp with a differential input including a positive operational amplifier input and a negative operational amplifier input and a differential output including a positive operational amplifier output and a negative operational output. The analog integrator 216 may further include two capacitors 242 and 244, and two resistors 246 and 248. The capacitor 242 may be coupled between the positive operational amplifier output and the negative operational amplifier input. The capacitor 244 may be coupled between the negative operational amplifier output and the positive operational amplifier input. The resistor 246 may be coupled between a negative input 212a of the amplifier 200 and the positive operational amplifier input. The resistor 248 may be coupled between a positive input 212b of the amplifier 200 and the negative operational amplifier input. The analog integrator 216 may be constructed as a first order loop filter.

In the analog integrator 216, the capacitors 242 and 244 may be dimensioned to assure stability of the loop and a good suppression of distortions from the power unit 218b. Increasing the capacitance of the capacitors 242 and 244 may reduce the bandwidth of the loop gain and may decrease the ability to suppress the distortions. The resistors 246 and 248 may define together with $R_1$ and $R_2$ a loop gain.

The operational amplifier Op Amp may be supplied by a regulated supply voltage between about 1 and about 2.5 Volts. Preferably, the supply voltage may be included between about 1.2 and about 1.8 Volts. Especially in portable devices, power resources may be limited and the Op Amp may be supplied by a supply voltage which may be as low as possible. The voltage supply may be regulated to add the less noise and distortion to the input signal.

The modulator unit 218a may include two comparators 250 and 252 as well as a triangular signal generator 254. A positive input of the comparator 250 may be connected to the positive operational amplifier output. A positive input of the comparator 252 may be connected to the negative operational amplifier output. A negative input of the comparator 250 and a negative input of the comparator 252 may be connected to an output of the triangular signal generator 254.

The power unit 218b or output stage 218b may include two drivers 238 and 240. An output of the comparator 250 may be coupled to the driver 240. An output of the comparator 252 may be coupled to the driver 238. The signals amplified by the drivers 238 and 240 may be transmitted to the differential output of amplifier 200 to which loudspeaker 202 may be coupled.

The power unit 218b may be supplied by a power supply with a supply voltage included between about 2.7 and about 5.4 Volts. The supply voltage may preferably be between about 3 and about 5 Volts. This supply voltage may correspond to the usually available battery voltage in a portable device such as a portable communication device like a mobile phone, a PDA, a laptop, a tablet and so on. The voltage supplied to the ternary pulse width modulator 218 and more specifically to the power unit 218b of the ternary pulse width modulator 218 may be greater than the voltage supplied to the analog integrator 216.

The triangular signal generator 254 may have an oscillation frequency included between about 300 kHz and about 2 MHz. The oscillation frequency may lie preferably between about 600 kHz and about 1 MHz. The difference between the oscillation frequency and the audible audio frequency may allow sampling of the audio signal.

An output of the driver 238 may be coupled via a feedback path 224 to the positive operational amplifier input of the Op Amp. The feedback path 224 may include a resistor $R_1$. An output of the driver 240 may be coupled via a feedback path 226 to the negative operational amplifier input of the Op Amp. The feedback path 226 may include a resistor $R_2$.

The analog integrator 216 may be a loop filter for the feedback loop provided between the output of amplifier 200 and the differential input of the operational amplifier Op Amp. More specifically, the analog integrator 216 may be a loop filter of first order. It is to be understood that the analog integrator 216 may be realized as a loop filter of second order or as a loop filter of third order or even higher order. As known to the person skilled in the art, higher order loop filters may provide a higher loop gain and may enhance overall performance of the loop. However, they may be more critical in terms of stability of the loop.

Figure 4:
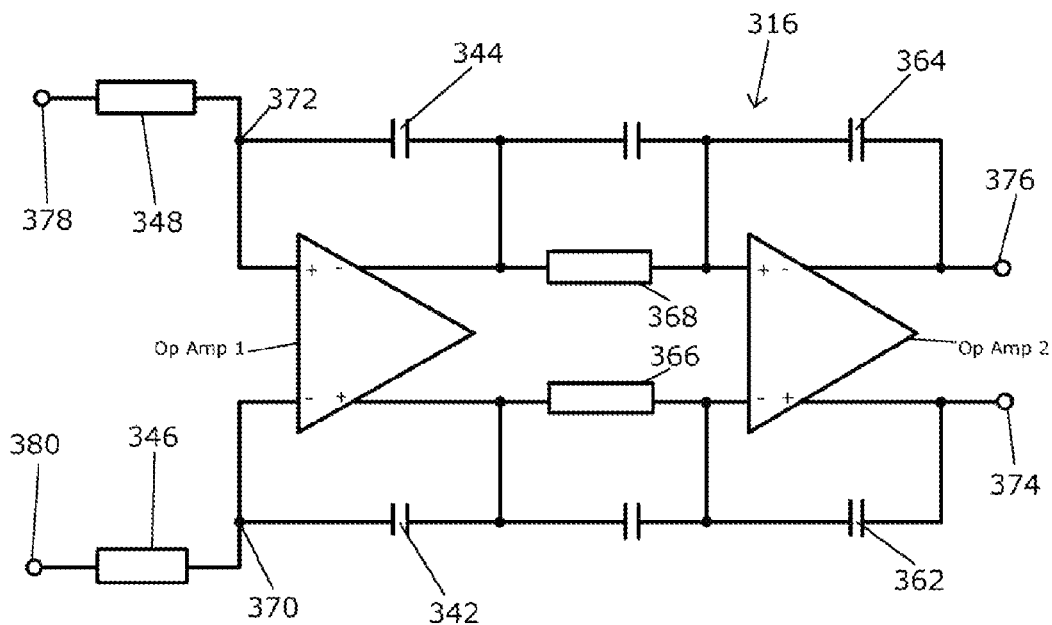
FIG. 4 shows a simplified schematic of an exemplary second order loop filter with a capacitive filter feedback.
Figure 5:
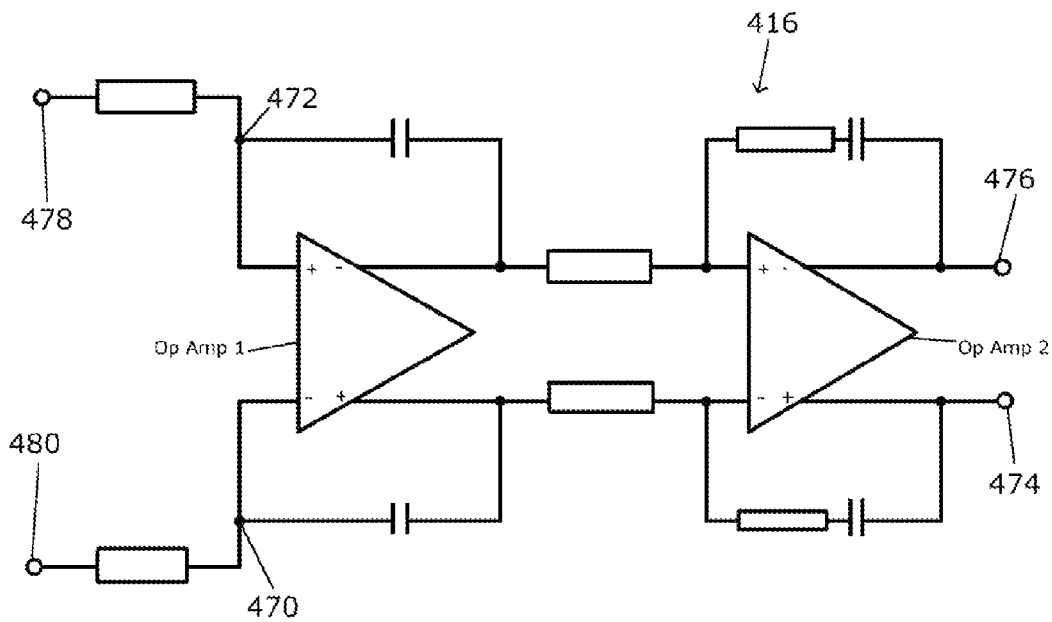
FIG. 5 shows a simplified schematic of an exemplary second order loop filter with a resistor and a capacitor in a filter feedback.

FIG. 4 and FIG. 5 show exemplary analog integrators 316 and 416, respectively, realized as second order loop filters, i.e. as series connection of two first order analog integrators. The analog integrator 316 may include a first operational amplifier Op Amp 1 and a second operational amplifier Op Amp 2. A resistor 348, a resistor 346, a capacitor 342 and a capacitor 344 may be connected to first operational amplifier Op Amp 1 to form a first analog integrator as shown in FIG. 3 and explained above with reference to FIG. 3. Similarly a resistor 368, a resistor 366, a capacitor 362 and a capacitor 364 may be connected to the second operational amplifier Op Amp 2 to form a second analog integrator which may be constructed in the same way as the first analog integrator. The second analog integrator may be coupled with its differential input to the differential output of the first analog integrator. The first and second analog integrators may be connected in series.

In the amplifier 200 shown in FIG. 3, the second order loop filter 316 as shown in FIG. 4 may replace analog integrator 216. An input 378 of analog the integrator 316 may then be coupled to the positive input 212b and an input 380 of the analog integrator 316 may then be coupled to the negative input 212a. A negative output 376 of the second operational amplifier Op Amp 2 may then be coupled to an input of comparator 252 and a positive output 374 of the second operational amplifier Op Amp 2 may then be coupled to an input of the comparator 250. The divert capacitor 222 may then be coupled to a node 370 to which a negative operational amplifier input may be connected and the divert capacitor 220 may then be coupled to a node 372 to which a positive operational amplifier input may be connected.

The analog integrator 416 may differ from the analog integrator 316 by a different realization of the feedback for the second operational amplifier and by the interconnection between the two first order analog integrators. In the amplifier 200 shown in FIG. 3, the second order loop filter 416 as shown in FIG. 5 may replace the analog integrator 216. An input 478 of the analog integrator 416 may then be coupled to the positive input 212b and an input 480 of the analog integrator 416 may then be coupled to the negative input 212a. A negative output 476 of the second operational amplifier Op Amp 2 may then be coupled to an input of the comparator 252 and a positive output 474 of the second operational amplifier Op Amp 2 may then be coupled to an input of the comparator 250. The divert capacitor 222 may then be coupled to a node 470 to which a negative operational amplifier input may be connected and the divert capacitor 220 may then be coupled to a node 472 to which a positive operational amplifier input may be connected.

FIG. 6 and FIG. 7 show exemplary analog integrators 516/616 realized as third order loop filters, i.e. as series connection of three first order analog integrators. They may replace analog integrator 216 in amplifier 200 as shown in FIG. 3. An input 578/678 may then be coupled to the positive input 212b and an input 580/680 may then be coupled to the negative input 212a. A negative output 576/676 may then be coupled to an input of the comparator 252 and a positive output 574/674 may then be coupled to an input of the comparator 250. The divert capacitor 222 may then be coupled to a node 570/670 to which a negative operational amplifier input may be connected and the divert capacitor 220 may then be coupled to a node 572/672 to which a positive operational amplifier input may be connected.

A capacitance value of the divert capacitors 220 and 222 may depend on the kind of analog integrator used, i.e. whether analog integrator is of first, second or third order and of the capacitance values of the capacitors 242 and 244. The capacitance value of the divert capacitors 220 and 222 may be included between 1 and 15 pF. Especially for higher order analog integrators but not limited thereto, the capacitance values may be included between 1 and 5 pF. The capacitance value of the divert capacitors 220 and 222 may be in the range of the capacitance values used for the capacitors 242 and 244.

Figure 8:
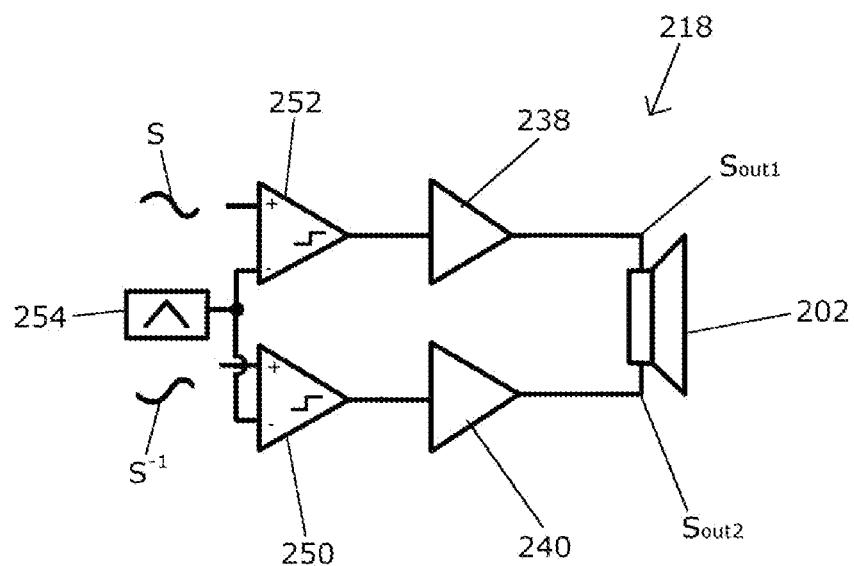
FIG. 8 shows a simplified schematic of an exemplary modulator for a ternary pulse width modulation.

The functioning of the modulator unit 218a is now further explained with reference to FIGS. 8, 9 and 10. FIG. 8 shows the pulse width modulator unit 218 of the amplifier 200 with the loudspeaker 202 coupled to the differential output. The comparator 252 may receive at its positive input a signal S.

The comparator 250 may receive at its positive input the inverse of signal S, i.e. a signal $S^{-1}$.

Figure 9:
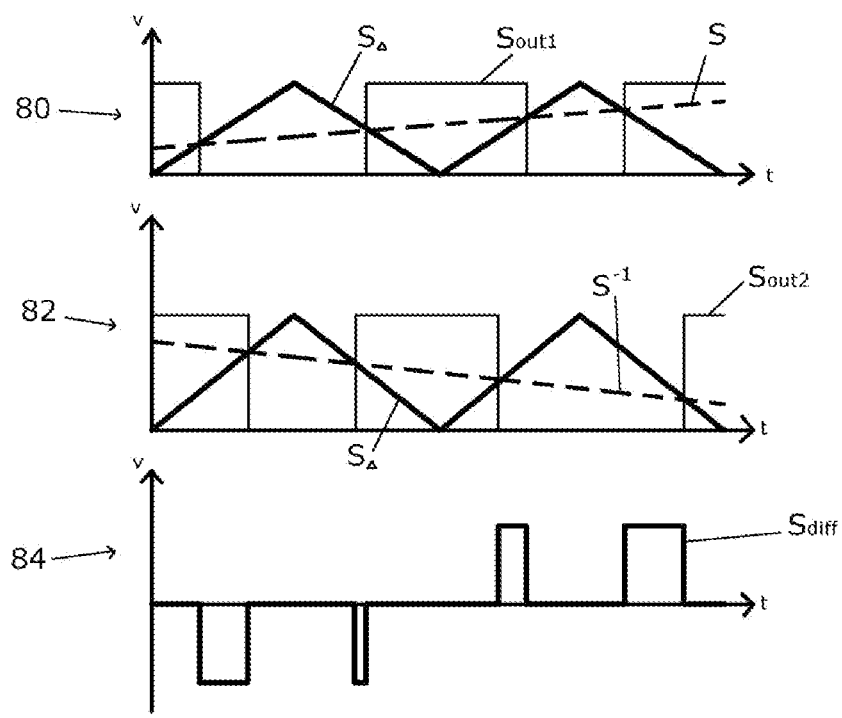
FIG. 9 shows in three separate voltage-over-time diagrams signals in the modulator of FIG. 8.

FIG. 9 includes three voltage-over-time diagrams 80, 82 and 84. The diagram 80 shows the signals at the comparator 252. The diagram 80 shows in a dashed line a time segment of signal S. A bold continuous line shows a time segment of a triangular signal $S_A$ as output from the triangular signal generator 254. As the frequency of the triangular signal $S_A$ is much higher than the frequency of the signal S, two periods of the triangular signal $S_A$ are visible in the diagram 80. The signal S may be compared in the comparator 252 to the triangular signal $S_A$. The diagram 80 shows in a light continuous line an output signal $S_{out1}$ of the comparator 252. The output signal $S_{out1}$ is a binary signal which is "high" when the voltage level of the signal S is greater than the voltage level of the triangular signal $S_A$ and which is "low" when the voltage level of the signal S is smaller than the voltage level of the triangular signal $S_A$. The output signal $S_{out1}$ may be amplified by the driver 238 and applied to the positive output of the amplifier and to a first input of the loudspeaker 202. This kind of pulse width modulation is a kind of natural sampling.

The diagram 82 shows the signals at the comparator 250. The diagram 82 shows in a dashed line a time segment of the inverse signal $S^{-1}$. A bold continuous line shows a time segment of the triangular signal $S_A$ as output from the triangular signal generator 254. It is the same triangular signal as applied to the comparator 252. The inverse signal $S^{-1}$ may be compared in the comparator 250 to the triangular signal $S_A$. The diagram 82 shows in a light continuous line an output signal $S_{out2}$ of the comparator 250. The output signal $S_{out2}$ is also a binary signal which is "high" when the voltage level of the inverse signal $S^{-1}$ is greater than the voltage level of the triangular signal $S_A$ and which is "low" when the voltage level of the signal S is smaller than the voltage level of the triangular signal $S_A$. The output signal $S_{out2}$ may be amplified by the driver 240 and applied to the negative output of the amplifier and to a second input of the loudspeaker 202.

The diagram 84 shows a differential signal $S_{diff}$ at the differential output, i.e. the signal as applied to the loudspeaker 202. The effect of amplification by the drivers 238 and 240 is not taken into account in FIG. 9. The differential signal $S_{diff}$ is the difference between the output signal $S_{out1}$ and the output signal $S_{out2}$. When both output signals $S_{out1}$ and $S_{out2}$ are "high", as e.g. on the left side of the diagrams 80, 82, 84, the differential signal $S_{diff}$ may be zero. When the output signal $S_{out1}$ is "high" and the output signal $S_{out2}$ is "low", the differential signal $S_{diff}$ may be positive. When the output signal $S_{out1}$ is "low" and the output signal $S_{out2}$ is "high", the differential signal $S_{diff}$ may be negative. When both output signals $S_{out1}$ and $S_{out2}$ are "low", the differential signal $S_{diff}$ may be zero. The differential signal $S_{diff}$ may be ternary with the three states "high", "low" and zero.

Figure 10:
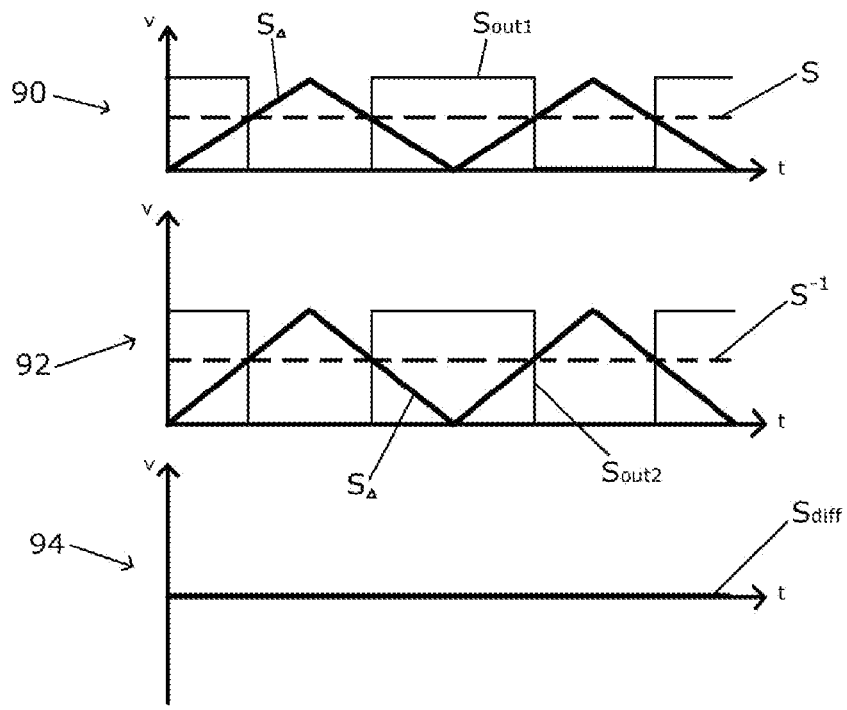
FIG. 10 shows in three separate voltage-over-time diagrams signals in the modulator of FIG. 8 when there is no signal input into the amplifier.

FIG. 10 includes three voltage-over-time diagrams 90, 92 and 94. The diagram 90 may correspond to the diagram 80 shown in FIG. 9 with the signal S shown in a dashed line, the triangular signal $S_A$ in a bold continuous line and the output signal $S_{out1}$ output from the comparator 252 from the driver 238 in a light continuous line. The diagram 92 may correspond to the diagram 82 shown in FIG. 9 with the signal $S^{-1}$ shown in a dashed line, the triangular signal $S_A$ in a bold continuous line and the output signal $S_{out1}$ output from the comparator 252 from the driver 238 shown in a light continuous line. The diagrams 90 and 92 differ from the diagrams 80 and 82 in that the signal S and consequently the inverse signal $S^{-1}$ input to the comparators 252 and 250 are zero in the diagrams of FIG. 10. Instead of zero the signals S and $S^{-1}$ may be more generally at a mid-voltage between a maximum amplitude and a minimum amplitude of the signal S. Therefore, the signal S may be equal to the inverse signal $S^{-1}$ and also the output signals $S_{out1}$ and $S_{out2}$ may be equal.

FIG. 10 shows in the diagram 94 the differential signal $S_{diff}$ at the differential output which is consequently also zero. The loudspeaker 202 sees correctly no signal input. However, as can be seen in FIG. 3, the output signals $S_{out1}$ and $S_{out2}$ may be fed back to the operational amplifier Op Amp separately. Therefore, a common mode signal may arrive at the differential input of Op Amp. Because of the capacitors 242 and 244, i.e. the filtering or integrating character of analog integrator 216, the operational amplifier Op Amp may see an about triangular-shaped voltage at its inputs.

As the drivers 238 and 240 may be supplied by a voltage supply which may be higher than the voltage supply of the operational amplifier Op Amp, the feedback common mode signal may swing between two voltage levels which may be too high for proper working of the Op Amp and therefore the divert capacitors 220 and 222 (see FIG. 3) may be provided which may divert the common mode signal current to an alternative current ground. It is to be understood that the common mode signal current may have the same frequency as the triangular generator frequency. The capacitors 220 and 222 may provide a high pass filter to a constant reference voltage. Thereby, the common mode voltage at the differential input of operational amplifier Op Amp may be kept small.

Increasing the capacitance values of the capacitors 242 and 244 would also allow to absorb more common mode signal current and to keep the change of the common mode voltage at the input of the analog integrator 216 small. However, increasing the capacitance values of the capacitors 242 and 244 may reduce the bandwidth of the loop gain and may decrease its ability to suppress distortions from the output stage.

In contrast, the capacitors 220 and 222 do not necessarily affect the transfer function of the integrator because the differential input of the Op Amp may be a very good virtual ground for differential signals, i.e. a better ground than provided via the capacitors 220 and 222. Therefore, differential signals will not be deviated via the capacitors 220 and 222. A differential current does not flow into the capacitors 220 and 222.

Figure 11:
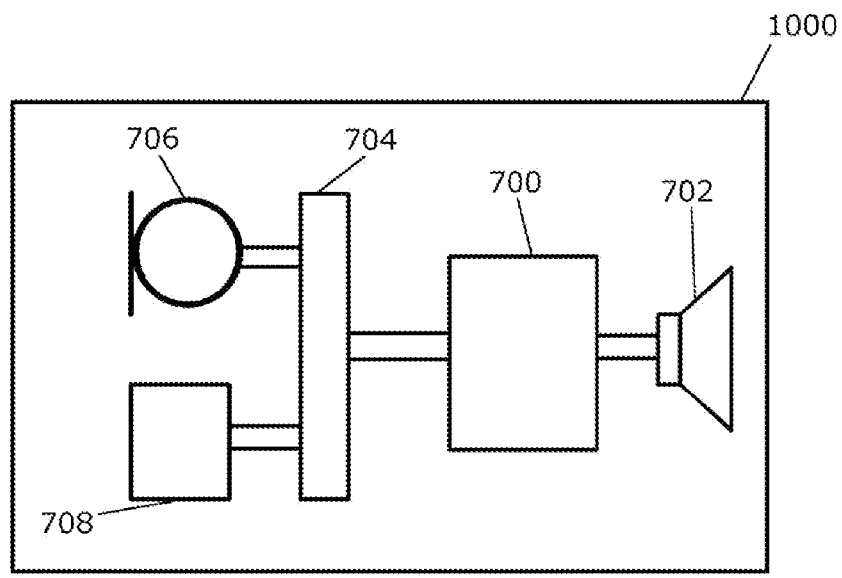
FIG. 11 shows a simplified block diagram of a mobile device including a differential amplifier.

FIG. 11 shows an exemplary mobile device 1000 including an amplifier 700, a loudspeaker 702, a switch 704, a microphone 706 and an audio signal player 708. The amplifier 700 may be realized as amplifier 10 of FIG. 1, as amplifier 100 of FIG. 2, or amplifier 200 of FIG. 3 including an analog integrator of $n^{th}$ order. The loudspeaker 702 may be coupled to a differential output of the amplifier 700. The switch 704 may be coupled to a differential input of the amplifier 700 allowing switching between the microphone 706 and the audio signal player 708 as an audio signal source which is to be amplified. The amplifier 700 may provide an audio drive which may have a power of more than 0.5 W, an efficiency of more than 70% and a signal to noise ratio SNR of more than 80 dB. The amplifier 700 may have a total harmonic distortion THD of greater 60 dB.

Figure 12:
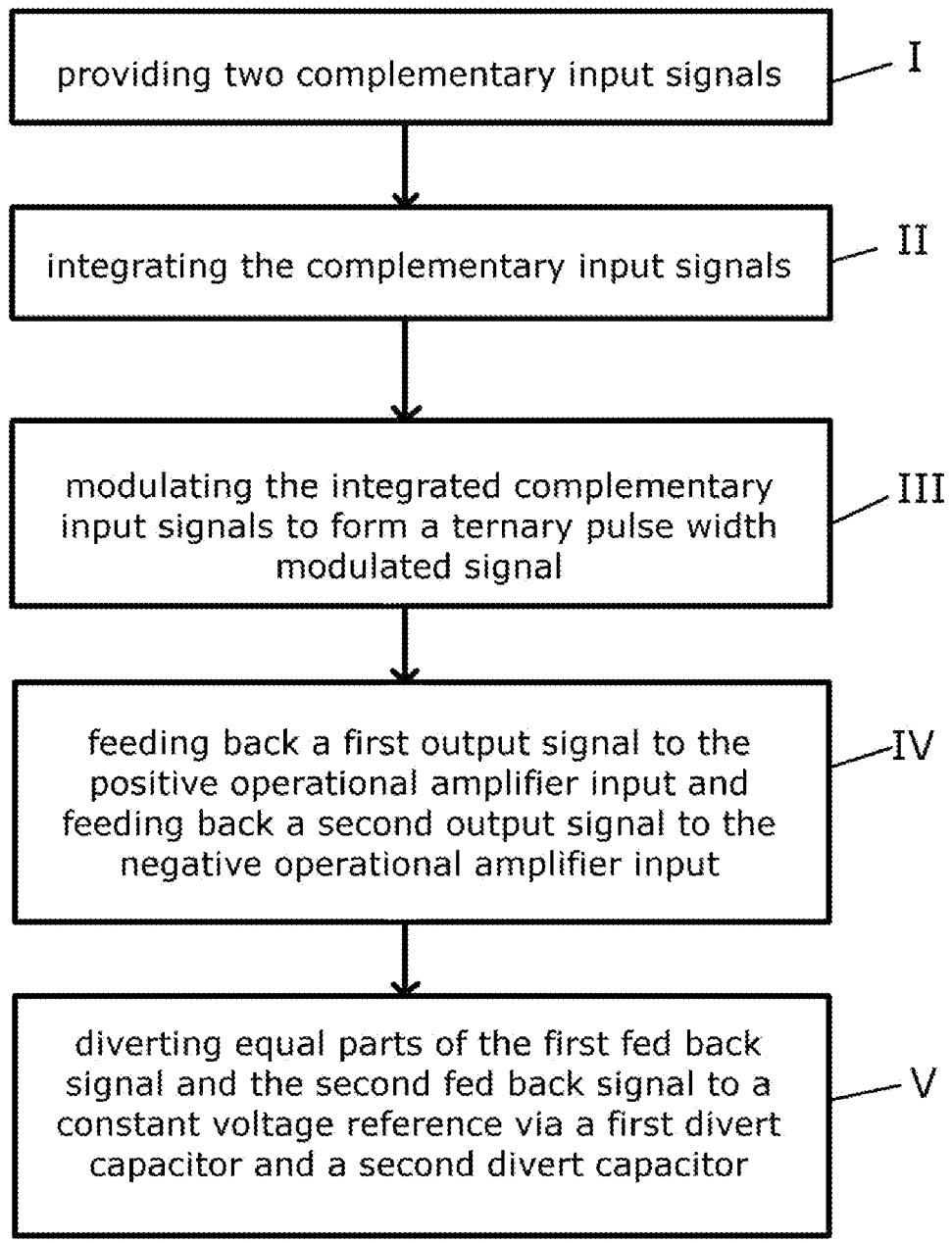
FIG. 12 shows a flow chart of an exemplary method for amplifying a signal.

FIG. 12 shows in a flow chart an exemplary method of amplifying a differential signal. At I, two complementary signals may be provided, e.g. audio signals generated by a microphone.

At II, the complementary input signals may be integrated, e.g. using an analog integrator of first, second, third or more generally $n^{th}$ order. They may be integrated separately. The integrated complementary input signals may be modulated at III in a pulse width modulator to form a ternary pulse width modulated signal at a differential output.

At IV, a signal from a first output of the differential output and a signal from a second output of the differential output may be fed back separately. At V, equal parts of the first feedback signal and the second feedback signal may be diverted to a constant voltage reference via a first divert capacitor and via a second divert capacitor, respectively.

While the disclosure has been illustrated and described with respect to one or more implementations, alterations and/or modifications may be made to the illustrated examples without departing from the scope of the appended claims. In particular, with regard to the various functions performed by the above described components or structures, the terms used to describe such components are intended to correspond, unless otherwise indicated, to any component or structure which performs the specified function of the described component (e.g. that is functionally equivalent), even though not structurally equivalent to the disclosed structure which performs the function in the herein illustrated exemplary implementations of the disclosure.

What is claimed is:

1. An amplifier, comprising:
   a differential input comprising a positive input and a negative input;
   an analog integrator comprising a differential integrator input and a differential integrator output, the analog integrator further comprising an operational amplifier, the operational amplifier comprising a positive operational amplifier input, a negative operational amplifier input, a positive operational amplifier output and a negative operational amplifier output, the differential integrator input being coupled to the differential input;
   a ternary pulse width modulator comprising two modulator inputs coupled to the differential integrator output and two modulator outputs;
   a first feedback path coupled between a first of the two modulator outputs and the positive operational amplifier input and a second feedback path coupled between a second of the two modulator outputs and the negative operational amplifier input; and
   a first divert capacitor coupled between the positive operational amplifier input and a constant voltage reference, and a second divert capacitor coupled between the negative operational amplifier input and the constant voltage reference.

2. The amplifier of claim 1, wherein the first divert capacitor and the second divert capacitor have the same capacitance.

3. The amplifier of claim 1, wherein the first divert capacitor and the second divert capacitor have the same voltage dependency.

4. The amplifier of claim 1, wherein the first divert capacitor and the second divert capacitor have a capacitance value each comprised between 1 and 15 pF.

5. The amplifier of claim 1, wherein the constant voltage reference is an alternative current ground.

6. The amplifier of claim 1, wherein the constant voltage reference is ground.

7. The amplifier of claim 1, wherein the analog integrator is connected to a first voltage supply, and the ternary pulse width modulator is connected to a second voltage supply, the first voltage being smaller than the second voltage.

8. The amplifier of claim 7, wherein the first voltage is comprised between 1 and 2.5 Volts.

9. The amplifier of claim 1, wherein the analog integrator is of $n^{th}$-order, n being an integer greater than one.

10. The amplifier of claim 1, wherein the ternary pulse width modulator comprises two comparators and a triangular signal generator, each comparator comprising a positive comparator input and a negative comparator input, the positive comparator inputs being coupled to the two modulator inputs, respectively, and the negative comparator inputs being coupled to an output of the triangular signal generator.

11. The amplifier of claim 10, wherein the triangular signal generator is configured to generate a periodic triangular signal with a frequency comprised between 300 kHz and 2 MHz.

12. The amplifier of claim 1, wherein the amplifier is comprised in an audio system comprising a loudspeaker coupled between the two modulator outputs.

13. The amplifier of claim 1, wherein the amplifier is comprised in a mobile device comprising a loudspeaker coupled between the two modulator outputs.

14. A method of amplifying a differential signal, comprising:
    providing a differential input signal to be amplified, the differential input signal comprising two complementary signals;
    integrating the complementary input signals;
    modulating the integrated complementary input signals to form a ternary pulse width modulated signal at a differential output;
    feeding back a signal from a first output of the differential output and feeding back a signal from a second output of the differential output separately; and
    diverting equal parts of the first feedback signal and the second feedback signal to a constant voltage reference via a first divert capacitor and a second divert capacitor, respectively.

15. The method of claim 14, wherein modulating the integrated complementary input signals comprises comparing a first of the integrated complementary input signals to a periodic triangular signal and comparing a second of the integrated complementary input signals to the triangular signal.

16. A differential amplifier, comprising:
    a first signal input configured to receive an analog input signal;
    a second signal input configured to receive the inverse analog input signal;
    an analog integrator coupled to receive the analog input signal and the inverse analog input signal;
    a first signal output configured to output the analog input signal in a pulse width modulated form;
    a second signal output configured to output the inverse analog input signal in a pulse width modulated form;
    a first feedback path coupled to feed the pulse width modulated analog input signal back to the analog integrator as a first feedback signal;
    a second feedback path coupled to feed the pulse width modulated analog inverse analog input signal back to the analog integrator as a second feedback signal; and
    a pair of matched divert capacitors, one of the capacitors coupled between the first feedback path and a constant voltage reference to divert part of the first feedback signal, and the other of the capacitors coupled between the second feedback path and the constant voltage reference to divert part of the second feedback signal.

17. The differential amplifier of claim 16, further comprising a differential pulse width modulator coupled between the analog integrator and the first and second signal outputs.

* * * * *